(12) United States Patent
Weichart et al.

(10) Patent No.: US 8,475,634 B2
(45) Date of Patent: Jul. 2, 2013

(54) APPLICATION OF HIPIMS TO THROUGH SILICON VIA METALLIZATION IN THREE-DIMENSIONAL WAFER PACKAGING

(75) Inventors: Jurgen Weichart, Balzers (LI); Stanislav Kadlec, Prague (CZ)

(73) Assignee: OC Oerlikon Balzers AF, Balzers (LI)

( * ) Notice: Subject to any disclaimer, the term of this patent is extended or adjusted under 35 U.S.C. 154(b) by 1254 days.

(21) Appl. No.: 12/257,570

(22) Filed: Oct. 24, 2008

(65) Prior Publication Data

US 2009/0111216 A1    Apr. 30, 2009

Related U.S. Application Data

(60) Provisional application No. 60/982,817, filed on Oct. 26, 2007.

(51) Int. Cl.
*C23C 14/34* (2006.01)
(52) U.S. Cl.
USPC ............ 204/192.12; 204/192.15; 204/192.17; 204/298.08
(58) Field of Classification Search
USPC .............. 204/298.08, 192.15, 192.17, 192.12
See application file for complete search history.

(56) References Cited

U.S. PATENT DOCUMENTS

| | | | | |
|---|---|---|---|---|
| 5,976,327 A | * | 11/1999 | Tanaka | 204/192.15 |
| 6,254,745 B1 | * | 7/2001 | Vukovic | 204/298.06 |
| 6,413,382 B1 | * | 7/2002 | Wang et al. | 204/192.12 |
| 2006/0094231 A1 | * | 5/2006 | Lane et al. | 438/637 |

* cited by examiner

*Primary Examiner* — Keith Hendricks
*Assistant Examiner* — Jason M Berman
(74) *Attorney, Agent, or Firm* — Pearne & Gordon LLP

(57) ABSTRACT

A method of magnetically enhanced sputtering an electrically-conductive material onto interior surfaces of a trench described herein includes providing a magnetic field adjacent to a target formed at least in part from the electrically-conductive material, and applying a DC voltage between an anode and the target as a plurality of pulses. A high-frequency signal is applied to the pedestal supporting the semiconductor substrate to generate a self-bias field adjacent to the semiconductor substrate. The high-frequency signal is applied to the pedestal in pulses, during periods of time that overlap with the periods during which the DC voltage pulses are applied. The periods of time that the high-frequency signals are applied include a duration that extends beyond termination of the DC voltage pulse applied between the anode and the target. During each DC voltage pulse the electrically-conductive material is sputter deposited onto the side walls of the trench formed in the semiconductor substrate.

20 Claims, 8 Drawing Sheets

APPLICATION OF HIPIMS TO THROUGH SILICON VIA METALLIZATION IN THREE-DIMENSIONAL WAFER PACKAGING

CROSS-REFERENCE TO RELATED APPLICATIONS

This application claims the benefit of U.S. Provisional Application No. 60/982,817, filed Oct. 26, 2007, the entirety of which is incorporated herein by reference.

BACKGROUND OF THE INVENTION

1. Field of the Invention

This application relates generally to an improved high power, impulse magnetron sputtering method and system, and more specifically to a high power, impulse magnetron sputtering method and system including synchronized delivery of a high-frequency signal to generate a maximum self bias voltage that occurs substantially simultaneously with a maximum DC current during a DC voltage pulse.

2. Description of Related Art

Semiconductor chips face constant development aimed at increasing the performance of circuits supported by the chips while decreasing the overall physical size of the chips. Physical limitations like power dissipation in integrated circuits ("ICs") and the process technology for fabricating ICs on an ever smaller scale have recently encouraged vertically stacking a plurality of chips instead of further increase the lateral device density to enhance performance. For example, current wire bonding techniques are limited in how closely spaced in a lateral dimension circuit elements can be formed on a semiconductor chip and electrically connected together using that technique. To allow further expansion of such devices the semiconductor chip can be enlarged to accommodate the additional circuit elements, but this leads to an enlargement of the overall size of the semiconductor chip rather than a reduction in size.

Instead of making the semiconductor chip larger in the lateral dimension, two or more substantially planar semiconductor chips or layers can be stacked vertically (i.e., their planar faces mated together) to provide the required area on the semiconductor chip to support the additional circuit elements. This so-called 3D integration of vertically stacked semiconductor chips can be utilized in a variety of different applications approaching maximum device density, such as computer memory, electro-optical devices, microelectromechanical ("MEMS") devices, sensors, above IC imagers, displays, as well as other technologies.

The vertically-stacked semiconductor chips are fabricated to include through-silicon vias ("TSVs") to establish electrical connections between the vertically-stacked semiconductor chips, and may include other high aspect ratio structures. The TSVs are high aspect ratio holes in the semiconductor chips that are plated with a metal or other suitable conductor to electrically connect two or more layers of circuit elements. Traditionally the TSVs have been formed by laser drilling or dry etching cavities into a top surface of the semiconductor chip's substrate, and an interior periphery of said cavities are then plated with a metal or other suitable conductor. A bottom surface of the substrate is then ground until the metal within the cavities is exposed at the bottom surface of the semiconductor chip to be stacked.

In order to minimize the surface area of each TSV exposed at the bottom surface of the semiconductor chip and utilize a substrate thickness that is manageable for the desired application, each TSV typically has an aspect ratio of at least 10:1, and possibly 20:1 or more in the future. Such high aspect ratios make it difficult to effectively plate the interior periphery of the cavities formed in the substrate with consistency using conventional deposition techniques.

Accordingly, there is a need in the art for a method and apparatus for forming a TSV in a substrate of a semiconductor chip for electrically connecting a plurality of semiconductor chips.

BRIEF SUMMARY

According to one aspect, the subject application involves a method of magnetically enhanced sputtering an electrically-conductive material onto interior surfaces of a trench comprising substantially vertical side walls and an aspect ratio of at least 10:1 formed in a semiconductor substrate and that is supported by a pedestal. The method includes providing a magnetic field adjacent to a surface of a target formed at least in part from the electrically-conductive material to be sputtered onto the interior surfaces of the trench; and applying a DC voltage between an anode and a cathode in a plurality of pulses, wherein the cathode includes the target. A high-frequency signal is applied to the pedestal supporting the semiconductor substrate to generate a self-bias field adjacent to said semiconductor substrate. The high-frequency signal is applied to the pedestal as pulses having a frequency within a range of from about 1 MHz to about 70 MHz, including any sub-ranges therein, and a duration that extends beyond termination of the pulse of the voltage between the anode and the cathode. During each pulse of the DC voltage applied between the anode and the cathode, the method further includes sputtering the electrically-conductive material from the target onto the substantially vertical side walls of the trench formed in the semiconductor substrate.

According to another aspect, the subject application involves a method of fabricating a stacked arrangement including a plurality of semiconductor substrates collectively supporting an integrated circuit. The method includes forming a trench in a first semiconductor substrate, the trench including an opening at a planar top surface of the first semiconductor substrate and substantially vertical side walls dimensioned to provide the trench with an aspect ratio of at least 10:1. The first semiconductor substrate including the trench is supported by a pedestal within a sputter reactor, and an electrically-conductive material is sputtered onto interior side walls of the trench. The sputtering is carried out according to a method that includes providing a magnetic field adjacent to a surface of a target formed at least in part from the electrically-conductive material to be sputtered onto the interior surfaces of the trench, and applying a DC voltage between an anode and a cathode in a plurality of pulses, wherein the cathode includes the target. A high-frequency signal is applied to the pedestal supporting the first semiconductor substrate to generate a self-bias field adjacent to said first semiconductor substrate. The high-frequency signal is applied to the pedestal in pulses at a frequency within a range of from about 1 MHz to about 70 MHz, including any sub-ranges therein, each pulse having a duration that extends beyond termination of the pulse of the DC voltage between the anode and the cathode. During each pulse of the voltage applied between the anode and the cathode, the electrically-conductive material is sputtered from the target onto the substantially vertical side walls of the trench formed in the semiconductor substrate. Subsequent to sputtering the electrically-conductive material onto the interior side walls of the trench, at least a portion of semiconductor material adjacent to a bottom planar surface of the semiconductor substrate is removed to at least partially expose the electrically-conductive material on the side walls at the bottom planar surface of the semiconductor substrate.

According to yet another aspect, the present application involves a sputtering apparatus for magnetically-enhanced sputtering an electrically-conductive material onto interior surfaces of a trench formed in a semiconductor substrate, the trench including substantially-vertical side walls and an aspect ratio of at least 10:1. The system includes a housing defining a substantially enclosed chamber in which sputtering occurs, and a pedestal extending into said chamber for supporting the semiconductor substrate at an appropriate position within said chamber during sputtering. A magnet assembly establishes a magnetic field adjacent to a surface of a target formed at least in part from the electrically-conductive material to be sputtered onto the interior surfaces of the trench. A DC voltage source is provided for applying a DC voltage between an anode and a cathode as a plurality of pulses, wherein the cathode includes the target. A variable power source is electrically connected to the pedestal for applying a high-frequency signal to the pedestal for supporting the semiconductor substrate to generate a self-bias field adjacent to said semiconductor substrate. A controller controls the variable power source to generate pulses of the high-frequency signal at a frequency within a range from about 1 MHz to about 70 MHz, including any sub-ranges therein, and applies the high-frequency signal to the pedestal for a duration that extends beyond termination of the pulse of the DC voltage between the anode and the cathode.

The above summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

BRIEF DESCRIPTION OF THE DRAWINGS

The invention may take physical form in certain parts and arrangement of parts, embodiments of which will be described in detail in this specification and illustrated in the accompanying drawings which form a part hereof and wherein.

DETAILED DESCRIPTION

Figure 1:
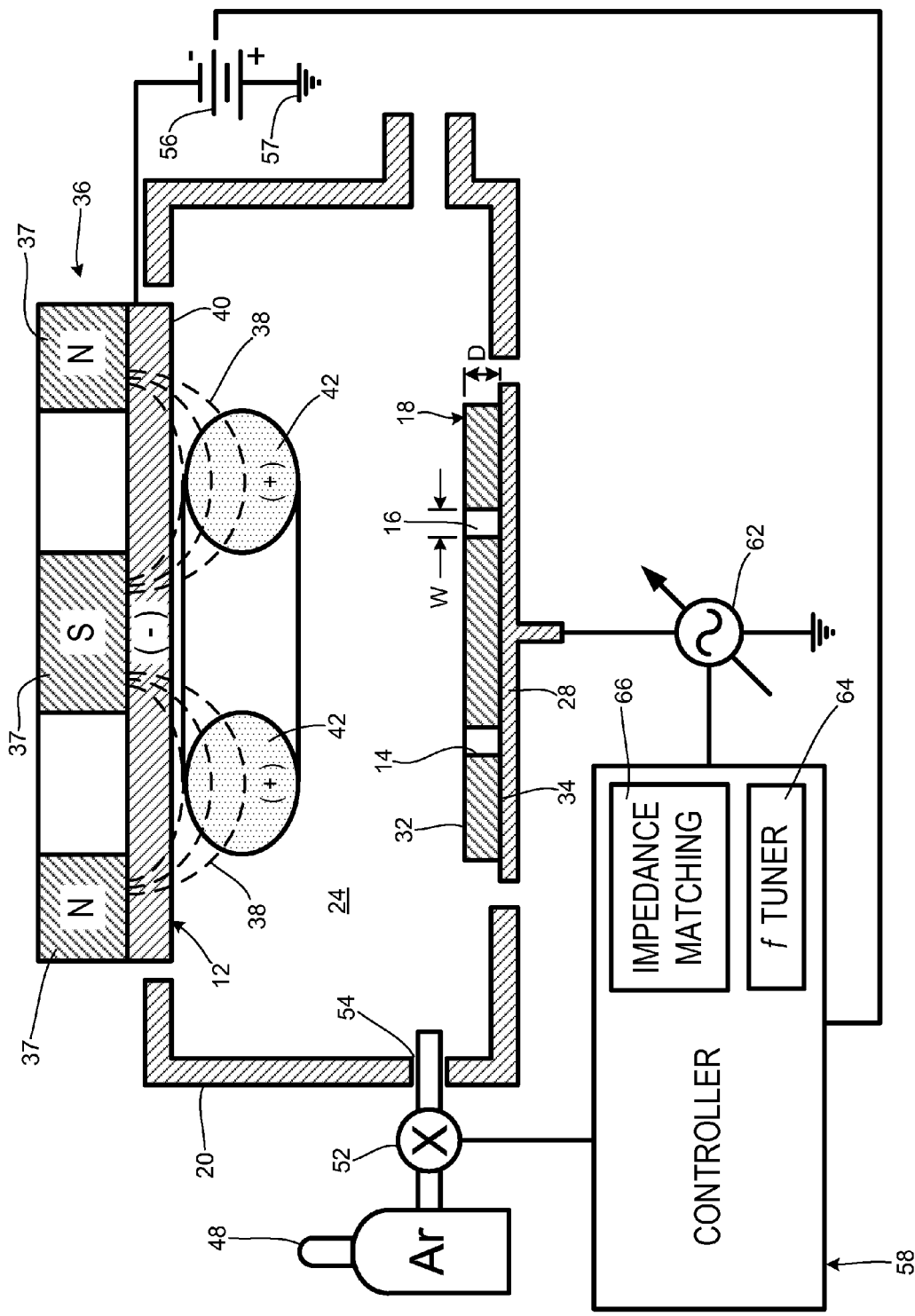
FIG. 1 shows an illustrative embodiment of a sputtering apparatus for sputter depositing an electrically-conductive material onto substantially-vertical side walls of a trench, wherein a portion of the sputter reactor has been cut away.

Certain terminology is used herein for convenience only and is not to be taken as a limitation on the present invention. Relative language used herein is best understood with reference to the drawings, in which like numerals are used to identify like or similar items. Further, in the drawings, certain features may be shown in somewhat schematic form.

It is also to be noted that the phrase "at least one of", if used herein, followed by a plurality of members herein means one of the members, or a combination of more than one of the members. For example, the phrase "at least one of a first widget and a second widget" means in the present application: the first widget, the second widget, or the first widget and the second widget. Likewise, "at least one of a first widget, a second widget and a third widget" means in the present application: the first widget, the second widget, the third widget, the first widget and the second widget, the first widget and the third widget, the second widget and the third widget, or the first widget and the second widget and the third widget.

The subject application relates to a sputtering apparatus 10 and a method for magnetically-enhanced sputtering an electrically-conductive material from a target 12 onto substantially vertical side walls 14 of a trench 16 formed in a semiconductor substrate 18. An illustrative arrangement of such a sputtering apparatus 10 is shown in FIG. 1, and includes a reactor housing 20 defining a substantially enclosed chamber 24 in which sputter deposition of the electrically-conductive material onto the semiconductor substrate 18 is to take place. A pedestal 28 fabricated from an electrically-conductive material such as a metal or metal alloy, for example, is exposed to, and optionally extends at least partially into the chamber 24 to support the semiconductor substrate 18 at an appropriate position within the chamber 24 for sputter deposition operations.

The semiconductor substrate 18 shown in FIG. 1 is a substantially planar wafer, having a top planar surface 32 and a bottom planar surface 34 that rests on the pedestal 28 within the chamber 24. The trench(es) 16 formed in the semiconductor substrate 18 can be open at the top planar surface 32 and closed by the bottom planar surface 34 to form a trench 16 having a generally ⊔-shaped cross section as shown in FIG. 1, that extends at least partially into the semiconductor substrate 18 along a depth D dimension. The side walls 14 define the interior periphery of the trench 16 between the top planar surface 32 and the bottom planar surface 34 of the semiconductor substrate 18. Each side wall can extend to a suitable depth D into the semiconductor substrate 18 relative to a width W of the trench 16 to give the trench 16 what is commonly referred to as an aspect ratio of at least 10:1. Other embodiments of the trench 16 can optionally have an aspect ratio of at least 20:1. Aspect ratios are expressed herein as a ratio of the depth of the trench 16 to the width of the trench 16.

A magnet assembly 36 including a plurality of permanent magnets 37 or other suitable magnetic field 38 generator is positioned to generate a magnetic field 38 adjacent to an exposed surface 40 of the target 12, which is formed at least in part from the electrically-conductive material to be sputter deposited onto the interior surfaces, such as the side walls 14 14, for example, of the trench 16. The magnetic field 38 generated by the magnet assembly 36 confines plasma 42 near, or optionally on the exposed surface 40 of the target 12 in what is referred to as a confinement region. Further, the magnetic field 38 also acts as an electron trap, altering the unbiased trajectories of secondary electrons ejected from the target 12 to maximize the likelihood that the sputtering gas within the confinement region will be ionized.

A sputtering gas, which is typically an inert gas such as argon for example, is supplied from a gas source 48 and metered into the chamber 24 through a mass flow controller 58 52 52, which is operatively connected to a controller 58 58. The sputtering gas flows through an inlet port 54 formed in the housing 20. The pressure in the chamber 24 is maintained by a vacuum pump system (not shown) operatively connected in fluid communication with the chamber 24. Although the chamber 24 has a standard pressure of about $10^{-8}$ Torr, typical sputtering operations not involving complete sustained self-sputtering, the chamber 24 pressure can be maintained within a range from about 0.1 milliTorr to about 5 milliTorr, including any sub-ranges therein.

The plasma 42 is initiated by flowing the argon or other sputtering gas into the chamber 24 and igniting it into a plasma 42 by selectively establishing a DC voltage with a DC power supply 56 electrically connected to the target 12 across a grounded anode 57 and a negatively-biased cathode, said cathode including the target 12. Although a higher DC voltage is needed for initiation, a target DC voltage of about −400 to −700 $V_{AC}$ maintains existence of the plasma 42 within the confinement region. Even after the DC voltage from the DC power supply 56 is terminated, charged particles remain in the chamber 24 and contribute to a decaying DC voltage for several tens of microseconds, resulting in an afterglow effect following termination of the DC voltage from the DC power supply 56. The controller 58 is also operatively coupled to the DC power supply 56 to control the output of that DC power supply 56 as described herein. Once the plasma 42 has been initiated, the supply of argon may also be reduced from the flow rate that existed at a time when the plasma 42 was initiated, or optionally discontinued altogether under direction from the controller 58.

A variable RF power source 62, or other suitably alternating power source, is electrically connected to the pedestal 28 to apply a high-frequency signal to the pedestal 28 and generate a DC self-bias field adjacent to the semiconductor substrate 18 supported on the pedestal 28 during sputtering operations. The DC self-bias field is effective to accelerate ions of the electrically-conductive material ejected from the target 12 in the direction perpendicular to the wafer 24, thus promoting sputtering of the electrically-conductive material onto the side walls 14 of the trench 16 having high aspect ratios, such as aspect ratios of at least 10:1, and according to alternate embodiments, at least 20:1. The self-bias voltage of the DC self-bias can be selectively controlled by varying the power of the high-frequency signal generated by the variable RF power supply 62 and delivered to the pedestal 28. For the illustrative embodiments discussed herein, the power of the high-frequency signal can be adjusted to any value within a range from about 300 Watts to about 3,000 Watts, including any sub-ranges therein.

Similar to the DC power supply 56 and flow controller 58 52, the variable RF power supply 62 can be controlled by the controller 58 to meet the needs of the desired sputtering process being carried out. For the embodiment shown in FIG. 1, the controller 58 includes a frequency tuner 64 for adjusting a frequency of the high-frequency signal from the variable RF power supply 62 to any frequency within a range from about 1 MHz to about 70 MHz, including any sub-ranges therein, according to illustrative embodiments, and within a range from about 1 MHz to about 50 MHz, including any sub-ranges therein, for other illustrative embodiments. According to yet other illustrative embodiments, the target frequency can be adjusted to about 13.56 MHz, and for any of the target frequencies, the frequency tuner 64 can adjust the frequency of the high-frequency signal within a suitable tolerance for the particular sputtering application. For example, the frequency tuner 64 can adjust the frequency of the high-frequency signal to within ±5%, or within any other suitable tolerance, of the target frequency. For the sake of brevity and clarity, however, the sputtering processes will be described below using a high-frequency signal within ±5% of a target frequency of about 13.56 MHz.

In addition to the frequency, the controller 58 can also control the duration of, or the duty cycle of pulses of the high-frequency signal applied to the pedestal 28. For example, the controller 58 can adjust the duty cycle of the high-frequency signal to a value that is larger, but optionally not significantly larger than the duty cycle of pulses of DC voltage from the DC power supply 56. According to other embodiments, the controller 58 can optionally maintain the supply of the high-frequency signal to the pedestal 28 at least as long as a pulse of DC voltage is being supplied to the target 12, and optionally discontinue, or at least reduce the power of the high-frequency signal applied to the pedestal 28 only after termination of the DC voltage across the target 12 and anode 57 by the DC power supply 56 as described in further detail below. According to yet other embodiments, the controller 58 can initiate transmission of the high-frequency signal to the pedestal 28 prior to initiation of a pulse of DC voltage from the DC power supply 56, maintain transmission of the high-frequency signal to the pedestal 28 for the duration of, and optionally beyond termination of, the pulse of DC voltage from the DC power supply 56, and discontinue transmission of the high-frequency signal to the pedestal 28 after termination of the pulse of DC voltage from the DC power supply 56.

An impedance matching network 66 is operatively connected to, and optionally integrated within the controller 58. The impedance matching network 66 adjusts the output impedance of the variable RF power supply 62 to approximately match the input impedance of the load to which the variable RF power supply 62 is supplying the high-frequency signal. Matching the impedances in such a manner maximizes the power transfer and minimizes reflected power from the load. The impedance matching network 66 can optionally be variable or fixed, and is operable to establish a maximum voltage of the DC self-bias field at approximately the same time as a maximum DC current is output by the DC power supply 56 during a DC pulse as described in detail below.

Figure 2:
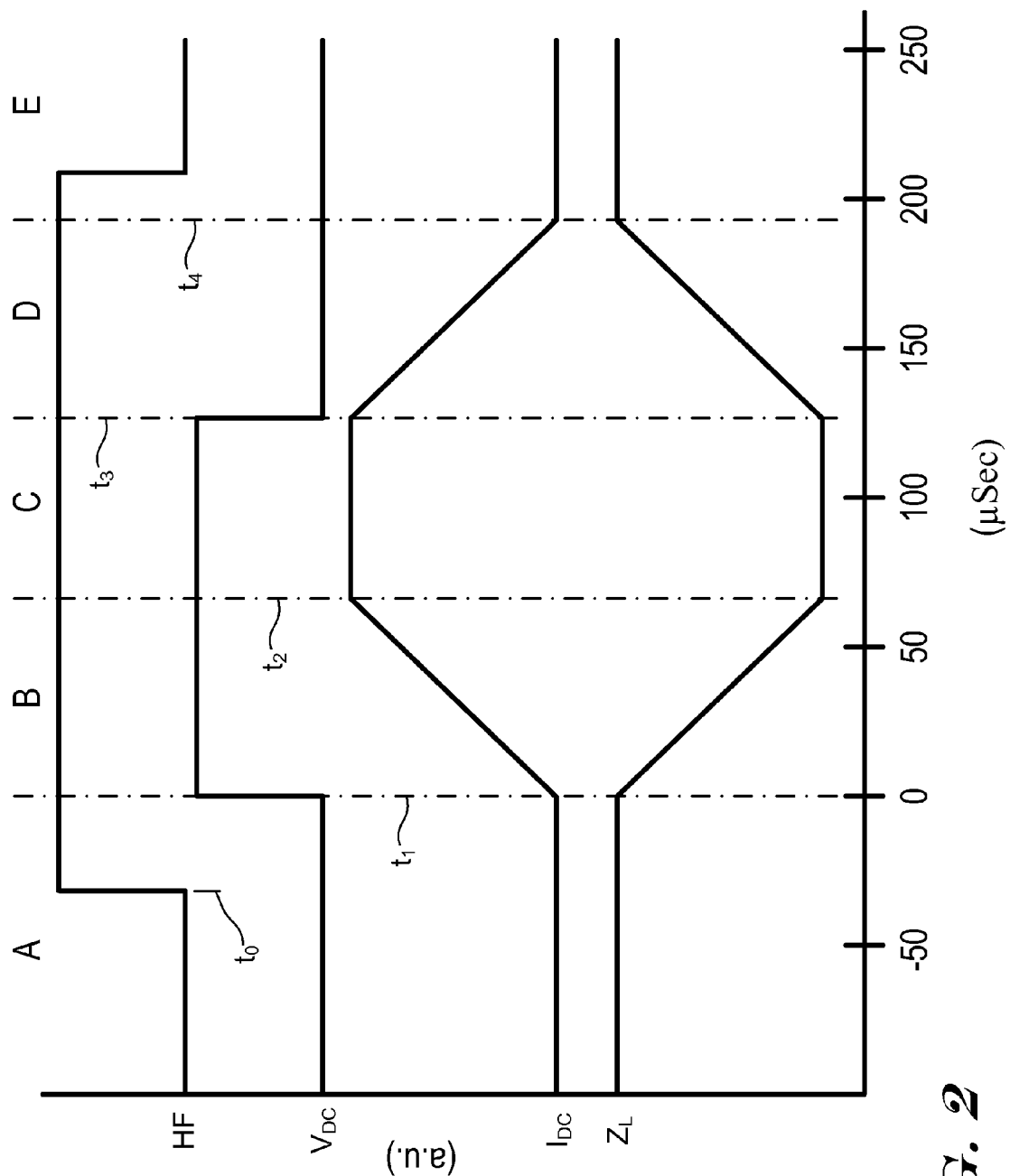
FIG. 2 shows an illustrative embodiment of a timing diagram for a pulse cycle of sputtering an electrically-conductive material onto substantially-vertical side walls of a trench.

An illustrative embodiment of a method of magnetically enhanced sputtering an electrically-conductive material onto interior surfaces, such as the side walls 14 for example, of a trench 16 formed in a semiconductor substrate 18 supported by the pedestal 28 can be understood with reference to the timing diagram of a pulse cycle shown in FIG. 2. As discussed above, the magnetic field 38 is established adjacent to the exposed surface 40 of the target 12, which again is formed at least in part from the electrically-conductive material to be sputtered onto the interior surfaces of the trench 16. The magnetic field 38 can be a permanent magnetic field 38 established by permanent magnets 37, or selectively established with an electromagnet, and serves to confine the plasma 42 that exists during sputtering within the confinement region. Argon gas, or any other suitable sputtering gas is introduced into the chamber 24 through the flow controller 58 52 operated by the controller 58 to establish a desired pressure for the particular sputtering application being performed.

In region A, the DC voltage is initially not established across the anode 57 and target 12 by the DC power supply 56, and the high-frequency signal is not initially being delivered to the pedestal 28. Without the DC voltage across the anode 57 and target 12, and without delivery of the high-frequency signal to the pedestal 28, there is little, if any, plasma 42 ignited within the chamber 24, and any such plasma 42 is a low-density plasma 42 with relatively high impedance. Prior to the establishment of a pulse of DC voltage from the DC power supply 56 across the anode 57 and target 12, delivery of the high-frequency signal from the variable RF power supply 62 to the pedestal 28 supporting the semiconductor substrate 18 is initiated at time $t_0$. Waveform HF in FIG. 2 depicts the power of the high-frequency signal from the variable RF power supply 62. Delivery of the high-frequency signal to the substrate generates the self-bias field having the self-bias voltage adjacent to said semiconductor substrate 18. For the description of the illustrative embodiment of the method, the high-frequency signal has a frequency of about 13.56 MHz when being delivered to the pedestal 28.

Subsequent $t_0$, a pulse of DC voltage from the DC power supply 56 is applied at $t_1$, shown as 0 seconds along the abscissa in FIG. 2, across the anode 57 and the target 12 to ignite the plasma 42 within the chamber 24. The DC voltage supplied by the DC power supply 56 is depicted in FIG. 2 as waveform $V_{DC}$. Time $t_1$ marks the end of period A of the pulse cycle in FIG. 2, and is the beginning of period B.

With the pulse of DC voltage from the DC power supply 56 established at time $t_1$, the DC current supplied by the DC power supply 56 gradually increases from this moment over time due at least in part to the increasing plasma 42 density, and accordingly, falling impedance of the plasma 42, until it reaches its maximum value at time $t_2$ marking the end of period B. The maximum value of the DC current can optionally reach the current-producing capacity of the DC power supply 56, at which time the DC current levels off as shown in period C, and does not continue to increase from its initial value at time $t_1$. The increasing DC current is depicted by waveform $I_{DC}$ in FIG. 2, and the variable plasma 42 impedance portion of the overall load across which the pulse of DC voltage is applied by the DC power supply 56 is depicted by waveform $Z_L$. The variable plasma 42 impedance portion of the overall load is also seen and supplied with the high-frequency signal by the variable RF power supply 62.

The DC current increases generally inversely proportionally to the decreasing overall load impedance seen by the DC power supply 56, which varies as a function of the plasma 42 density within the chamber 24. Other factors that can affect the impedance seen by the DC power supply 56, the variable RF power supply 62, or both, include but are not necessarily limited to, the output impedance of the DC power supply 56 and the variable RF power supply 62, the impedance of the electric connectors used to electrically connect the DC power supply 56 and the variable RF power supply 62 to their respective loads, the target 12 and chamber 24 dimensions, the target 12 material, and pressure in the chamber 24.

Both the pulse of DC voltage from the DC power supply 56 and the high-frequency signal from the variable RF power supply 62 are supplied throughout period C of the pulse cycle of FIG. 2 until, at time $t_3$, the DC voltage from the DC power supply 56 ceases to be applied across the anode 57 and target 12. Also, from time $t_2$ to time $t_3$ the DC current and plasma 42 impedance remain generally unchanged at their maximum and minimum values, respectively.

The pulse of DC voltage applied between time $t_1$ and time $t_3$ can have any suitable duration for the particular sputtering being performed. Although shown as having a duration of about 130 microseconds in FIG. 2, other embodiments can include a pulse of DC voltage lasting less than 100 microseconds. Other embodiments optionally include a DC voltage pulse duration that is shorter than the period of time between time $t_1$ and $t_2$ in FIG. 2 required for the DC current to reach its maximum value, in which case the DC current and plasma 42 impedance do not level off during the DC voltage pulse. Further, the DC voltage pulses can be repeatedly applied between the anode 57 and target 12 with a duty cycle within a range from about 0.5% to about 10%, including any and all sub-ranges therein.

At time $t_3$, the DC voltage pulse from the DC power source is discontinued, and accordingly, the DC current gradually decreases from its maximum value and approaches the DC current that existed prior to application of the DC voltage pulse across the anode 57 and target 12 at time $t_1$. At time $t_3$, however, when the DC voltage is discontinued, the high-frequency signal is still being delivered to the pedestal 28 from the variable RF power supply 62. Since transmission of the high-frequency signal to the pedestal 28 begins before application of the DC voltage pulse, continues throughout the application of the DC voltage pulse, and ends after the DC voltage pulse is discontinued, the high-frequency signal is said to be substantially simultaneously delivered to the pedestal 28 for the entire duration of the DC voltage pulse applied across the anode 57 and target 12. In other words, delivery of the high-frequency signal completely overlaps application of the DC voltage pulse across the anode 57 and target 12, continues to be delivered to the pedestal 28 after application of the DC voltage pulse has been discontinued, and thus the controller 58 has synchronized delivery of the high-frequency signal with application of the DC voltage pulse.

A plurality of DC voltage pulses are to be repeatedly applied between the anode 57 and target 12 with a duty cycle within a range from about 0.5% to about 10%, including any and all sub-ranges therein. For such embodiments, each DC voltage pulse can be completely overlapped by a pulse of the high-frequency signal delivered to the pedestal 28. Thus, the high-frequency signal will be repeatedly delivered to the pedestal 28 in pulses having a duty cycle within a range from about 2% to about 12%, enough to begin delivery of the high-frequency signal to the pedestal 28 before application of the DC voltage pulse and discontinue delivery of the high-frequency signal subsequent to removal of the DC voltage pulse. For example, if a plurality of DC voltage pulses is applied with a duty cycle of 5%, then the high-frequency signal can be applied with a duty cycle of about 7%. The periods of time when the DC voltage pulses are applied across the anode 57 and target 12 can optionally be centrally synchronized with the periods of time during which the high-frequency signal is being delivered to the pedestal 28 (i.e., the midpoint of each period occurs at approximately the same time). Thus, the amount of time that elapses between initial delivery of the high-frequency signal and subsequent application of the DC voltage pulse is about the same as the amount of time that elapses between removal of the DC voltage pulse and subsequent termination of delivery of the high-frequency signal to the pedestal 28 occurs.

As mentioned before, the afterglow effect allows the DC current to gradually decrease to its starting value for the next DC pulse. After the DC voltage from the DC power supply 56 is terminated, charged particles remain in the chamber 24 and contribute to a decaying DC voltage therein, independent of the DC voltage previously supplied by the DC power supply 56, for several tens of microseconds. At time t4 the DC current and plasma 42 impedance substantially return to their initial, unbiased values, and remain generally unchanged until the subsequent application of the DC voltage pulse following a suitable period of time depending on the duty cycle selected for the particular sputtering application.

The impedance matching network 66 provided to the sputtering apparatus 10 matches the variable impedance of the load supplied or "seen" by the variable RF power supply 62 throughout each of the plurality of pulse cycles. Matching the variable impedance of the load, which varies proportionally to the rising and falling plasma 42 impedance, causes a maximum self-bias voltage to occur approximately simultaneously with a maximum DC current during the pulse of voltage applied between the anode 57 and the cathode. And to minimize the effect of the changes in the plasma 42 impedance for different pulse cycles, the frequency tuner 64 of the controller 58 can vary the frequency of the high-frequency signal as needed to enable the variable RF power supply 62 to supply the high-frequency signal to substantially similar load impedance for each pulse cycle.

Figure 3:
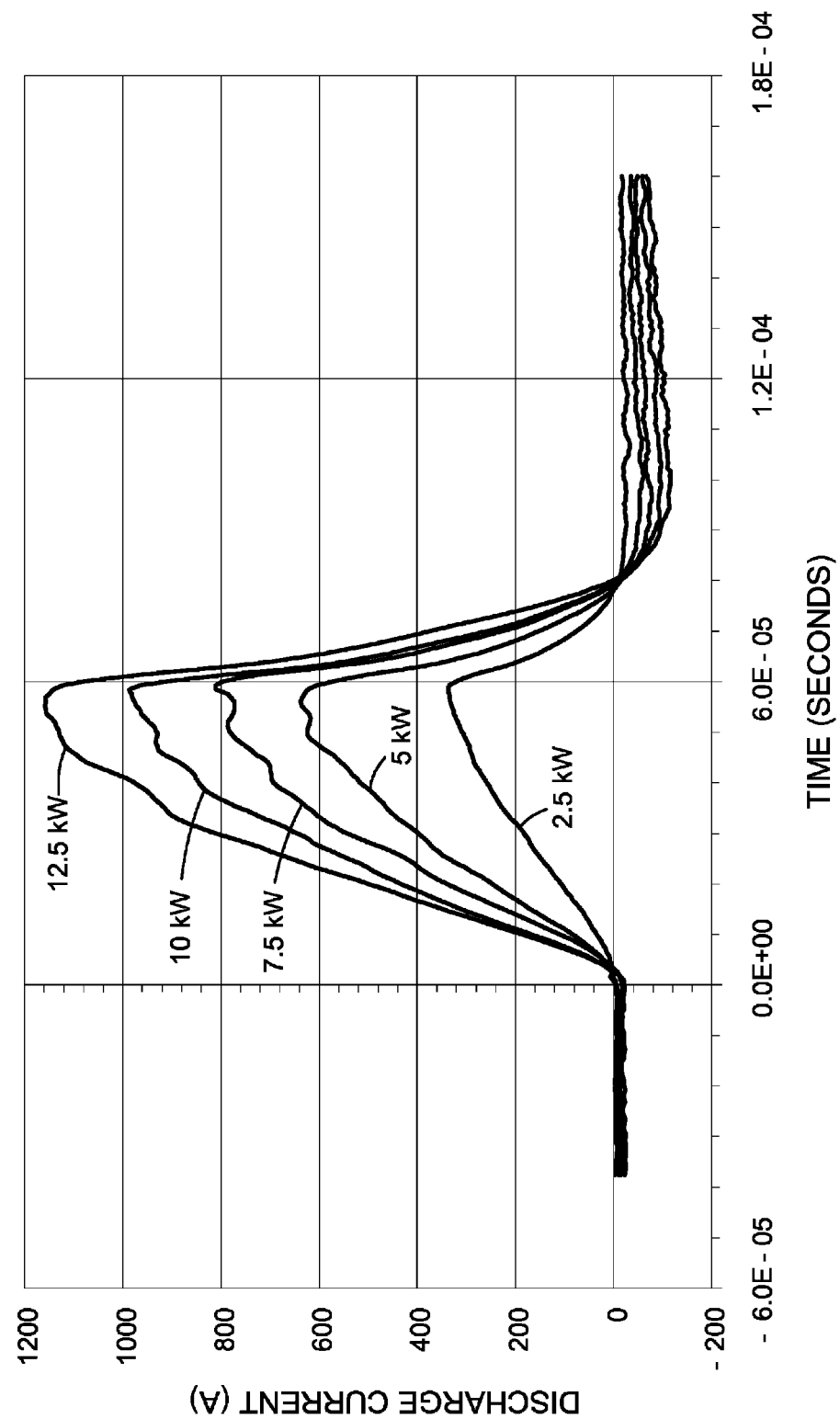
FIG. 3 shows a discharge current waveform of a HIPIMS pulse of DC voltage having a duration of approximately 60 microseconds as a function of time.
Figure 4:
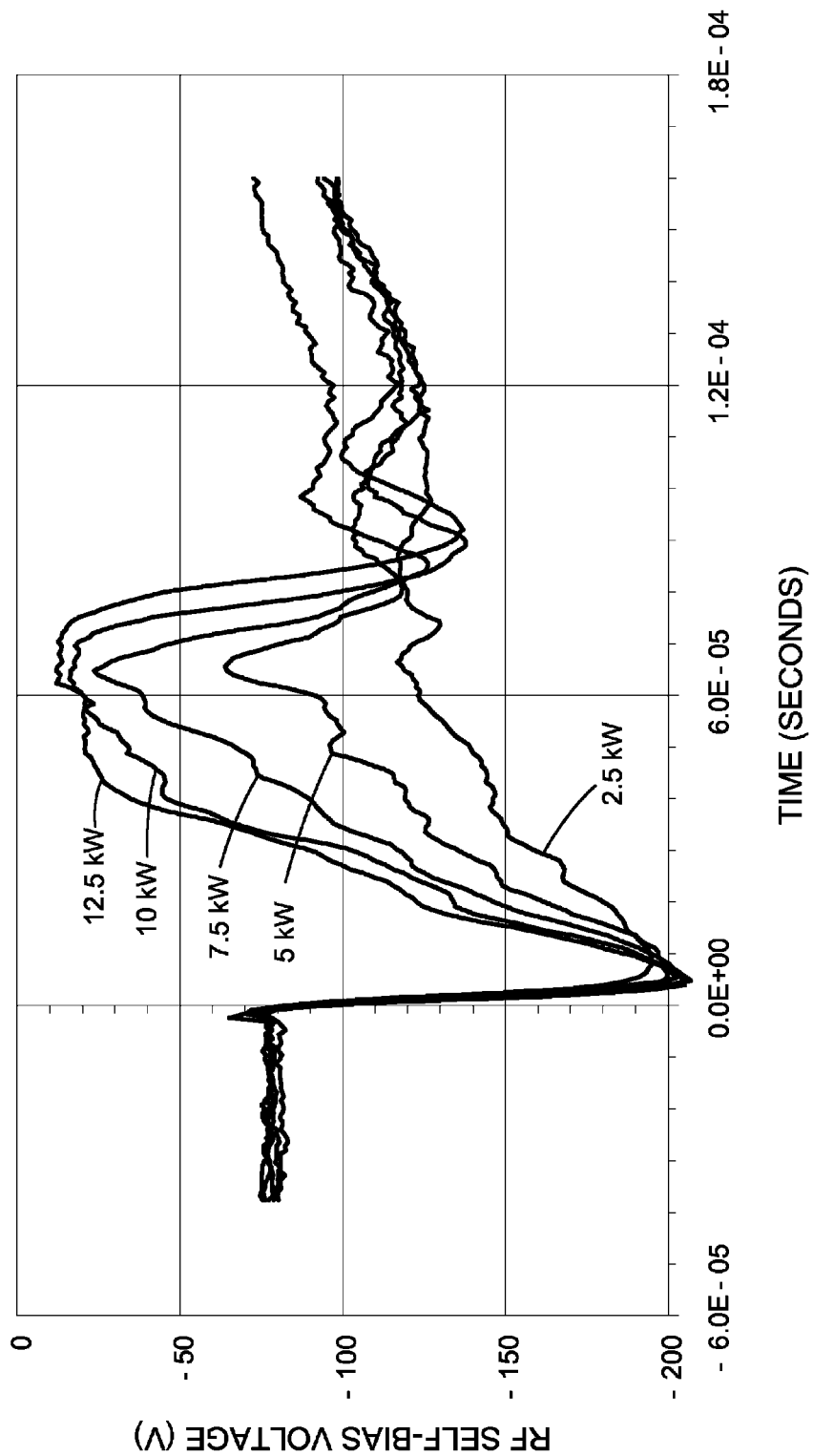
FIG. 4 shows a self-bias voltage waveform generated by a high-frequency signal being applied to a pedestal supporting a substrate on which the electrically-conductive material is being sputtered as a function of time, said high-frequency signal being applied to the pedestal during the HIPIMS pulse.

FIG. 3 shows illustrative examples of the DC current for different DC pulse power levels during a pulse cycle including a pulse that lasts about 60 microseconds. FIG. 4 shows illustrative examples of the corresponding reaction of the self bias voltage of the self bias field at the semiconductor substrate 18 generated by the variable RF power supply 62 for the same power levels. As can be seen in FIG. 3, the maximum DC current for each separate power level trace occurs approximately 60 microseconds (i.e., 6.0E-05 along the abscissa) after application of the DC voltage for this particular pulse cycle. Similarly, FIG. 4 reveals that maximum self bias voltage for each power level trace also occurs at approximately 60 microseconds (within a reasonably close proximity thereof) following application of the DC voltage pulse across the anode 57 and target 12 during the subject pulse cycle. Thus, the maximum DC current and maximum self bias voltage occur substantially simultaneously for each pulse cycle for the respective power levels.

As a result of the DC voltage pulses applied between the anode 57 and the target 12, atoms of the electrically-conductive material ejected from the target 12 are deposited onto the substantially vertical side walls 14 of the trench 16 formed in the semiconductor substrate 18, optionally in addition to other surfaces of the semiconductor substrate 18. As another optional step, to create a through-silicon via, for example, at least a portion of the bottom planar surface 34 of the semiconductor substrate 18 can be removed by grinding, polishing or other suitable process for example. Removing the portion of the bottom surface of the semiconductor substrate 18 exposes the electrically-conductive material sputter deposited onto the vertical side walls 14 to the modified bottom planar surface 34 of the semiconductor substrate 18.

At that point, the exposed electrically-conductive material can be electrically connected to circuit components printed at, or near both the top planar surface 32 and the bottom planar surface 34 of the semiconductor substrate 18, and the semiconductor substrate 18 optionally assembled vertically (i.e., mating planar surfaces) with another, similar semiconductor substrate 18. For example, the electrically-conductive material at least partially exposed at the bottom planar surface 34 of the semiconductor substrate 18 can be aligned with an electrical contact provided to the second semiconductor substrate 18, and connected thereto to form a stacked arrangement.

EXPERIMENTAL EXAMPLE

Figure 5:
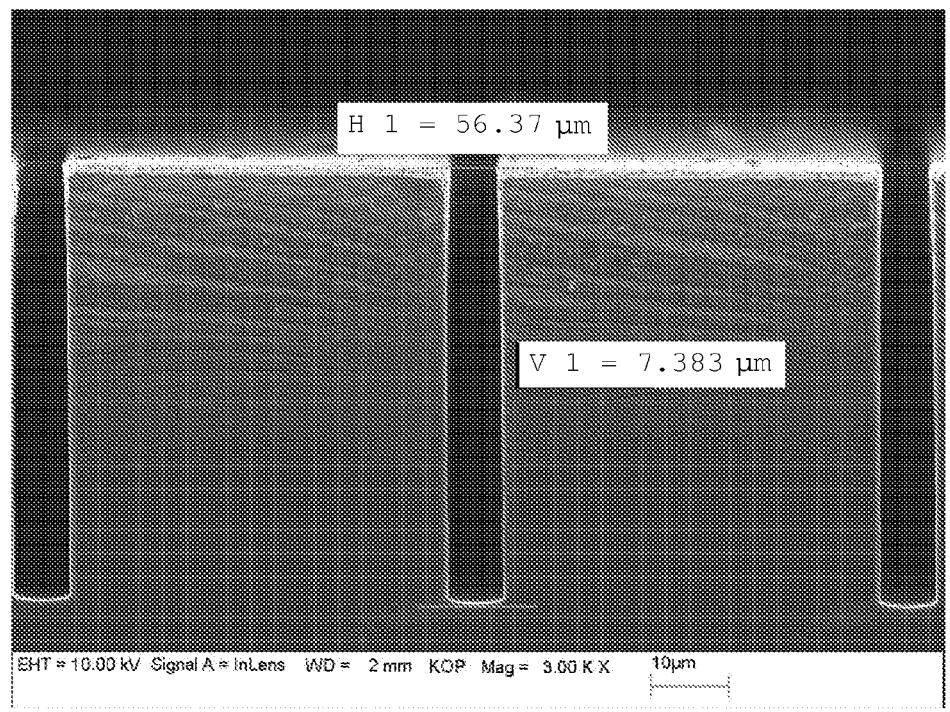
FIG. 5 is a scanning electron microscope ("SEM") photograph of a trench formed in a Si semiconductor substrate viewed with a magnification of 3,000 times and coated by a HIPIMS method and apparatus according to an aspect of the invention.
Figure 6:
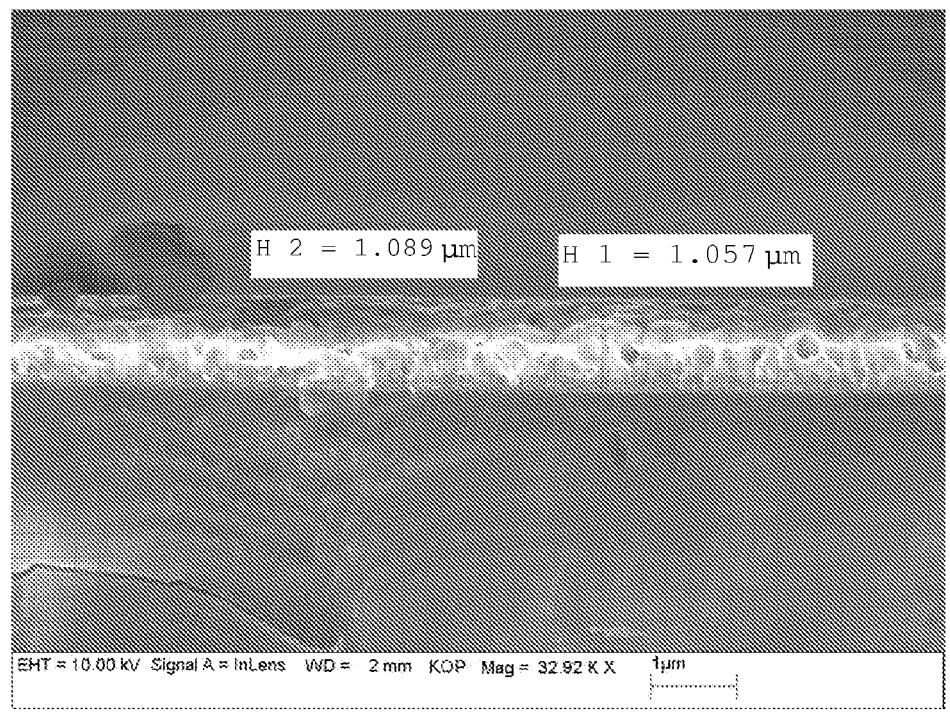
FIG. 6 is a SEM photograph showing a top portion of a trench formed in a Si semiconductor substrate magnified about 32,920 times and having an aspect ratio of about 10:1, wherein the top portion has been coated by a HIPIMS method and apparatus according to an aspect of the invention.
Figure 7:
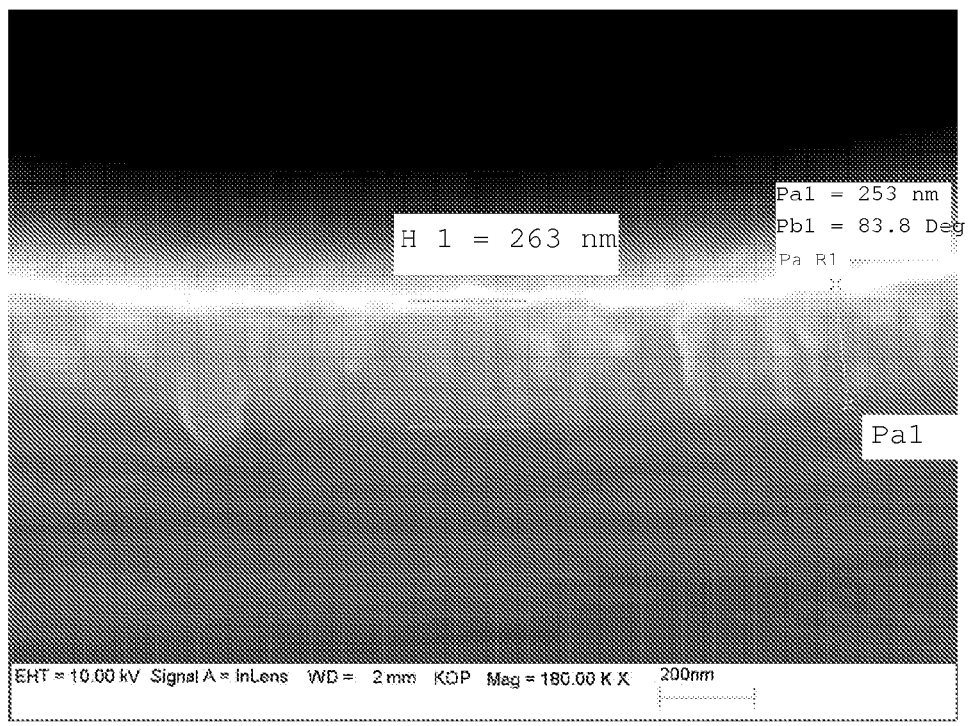
FIG. 7 is a SEM photograph showing a bottom portion of the trench described with reference to FIG. 6 magnified about 180,000 times, wherein the bottom portion has been coated by a HIPIMS method and apparatus according to an aspect of the invention.

Deposition runs according to an HIPIMS deposition method and system according to embodiments of the invention were performed utilizing a RF high-frequency signal and a low impedance matching network 66 to deposit a Tantalum ("Ta") onto exposed surfaces of a trench formed in a silicon ("Si") semiconductor substrate. The deep trenches were etched in the Si semiconductor substrate by Deep Silicon Etch Process ("DSE") as are known in the art to provide substantially-vertical sidewalls and an aspect ratio of about 10:1. The results of the HIPIMS deposition are shown in FIGS. 5-7, which reveal coverage of a bottom portion of the trench that is greater than 25%. The layer deposited onto a top portion of the trench as shown in FIG. 6 has a thickness of about 1060 nm, and the layer deposited onto a bottom portion of the trench as shown in FIG. 7 has a thickness of about 263 nm. Compared to conventional deposition techniques that result in a bottom coverage of about 15% or less under similar processing conditions, the method and system according to embodiments of the present invention provide a desirable improvement. The deposition rate for the experimental example of the HIPIMS method and apparatus was about 1.5 nm/s.

Further, the pre-ionization caused by the pulsed high-frequency signal with low duty cycle according to the present method contributed to sustain stable plasma with a reduction of the amount of energy applied relative to the energy requirement to sustain the suitable plasma without the pulsed high-frequency signal with low duty cycle during the long off-time of the short duty cycle. By this the back-sputtering of the substrate, leading to deposition rate reduction, as well as charging and heating of the substrate are minimized. Using present HIPIMS method and apparatus in 3D packaging, also referred to herein as stacking, has the advantage to provide very dense layers as compared to conventional PVD.

Figure 8A:
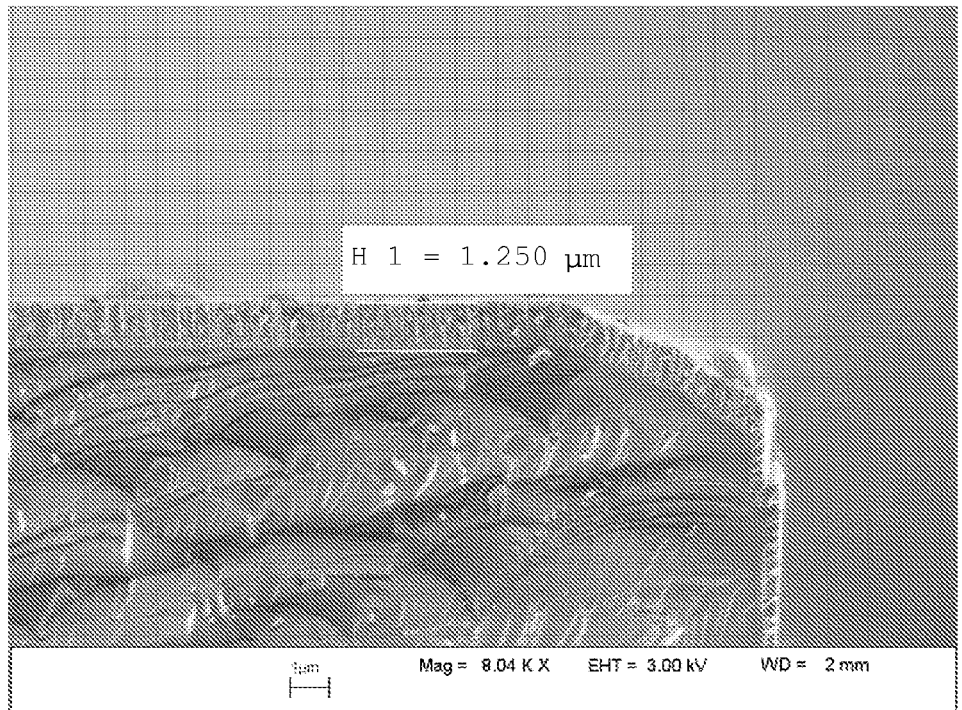
FIG. 8A is a SEM photograph with magnification of about 8,040 times showing a cross section of a Ta layer deposited adjacent to a top portion of a trench formed in a semiconductor substrate according to a conventional vapor deposition process.

For example, the SEM photograph in FIG. 8A with magnification of about 8,040 times shows a cross section of a Ta layer deposited adjacent to a top portion of a trench formed in a semiconductor substrate according to a conventional vapor deposition process. Note the significantly pronounced, vertically-oriented columnar grains extending through the Ta layer. This Ta layer was deposited according to a conventional vapor deposition process applying a RF high-frequency signal to the substrate resulting in a deposition rate of about 2.5 nm/s.

Figure 8B:
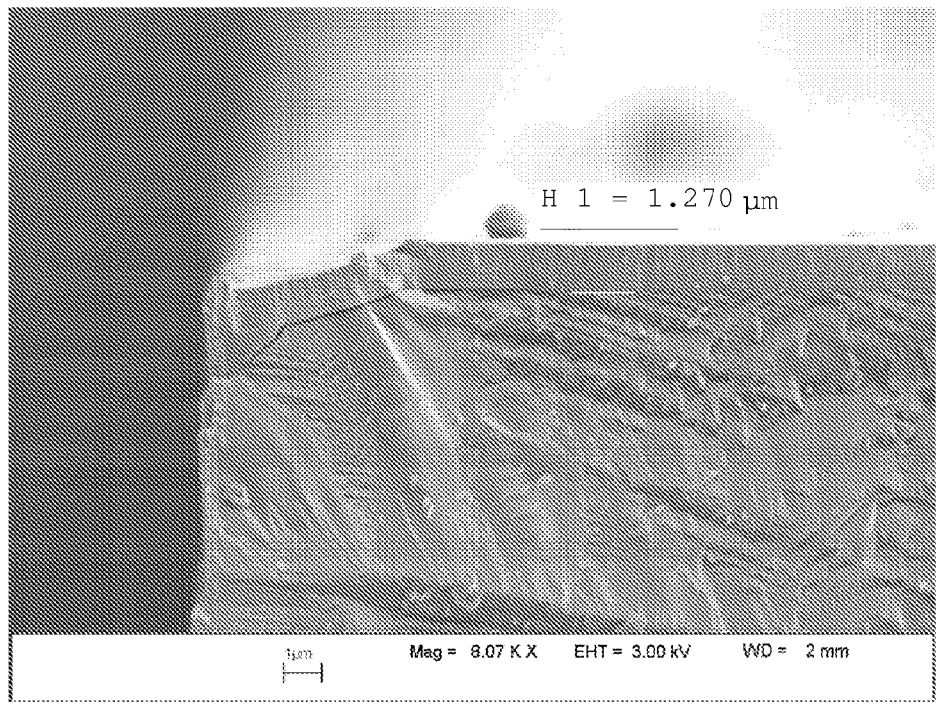
FIG. 8B is a SEM photograph with magnification of about 8,070 times showing a cross section of a Ta layer deposited adjacent to a top portion of a trench formed in a semiconductor substrate according to a HIPIMS method and apparatus according to an aspect of the invention.

In contrast, FIG. 8B shows a SEM photograph with magnification of about 8,070 times displaying a cross section of a Ta layer deposited adjacent to a top portion of a similar trench formed in a semiconductor substrate according to a HIPIMS method and apparatus according to an aspect of the invention, resulting in a deposition rate of about 1.3 nm/s. Note that the vertically-oriented, columnar grains extending through the Ta layer have a higher density and are much less pronounced. Thus, fewer pores result from the present HIPIMS method and apparatus than result from conventional vapor deposition methods and apparatuses. The high density of barrier layers formed from Ti or Ta, for example, with minimal pores minimizes diffusion of Cu, for example, into the underlying device during fabrication. Due to the high density of such a barrier layer produced by the present HIPIMS method and apparatus it is expected that the thickness of such barrier layers required to minimize diffusion of Cu into an underlying device to a desirably low level can be less than a thickness of the barrier layer produced by conventional vapor deposition techniques required to similarly minimize diffusion of Cu.

Figure 8C:
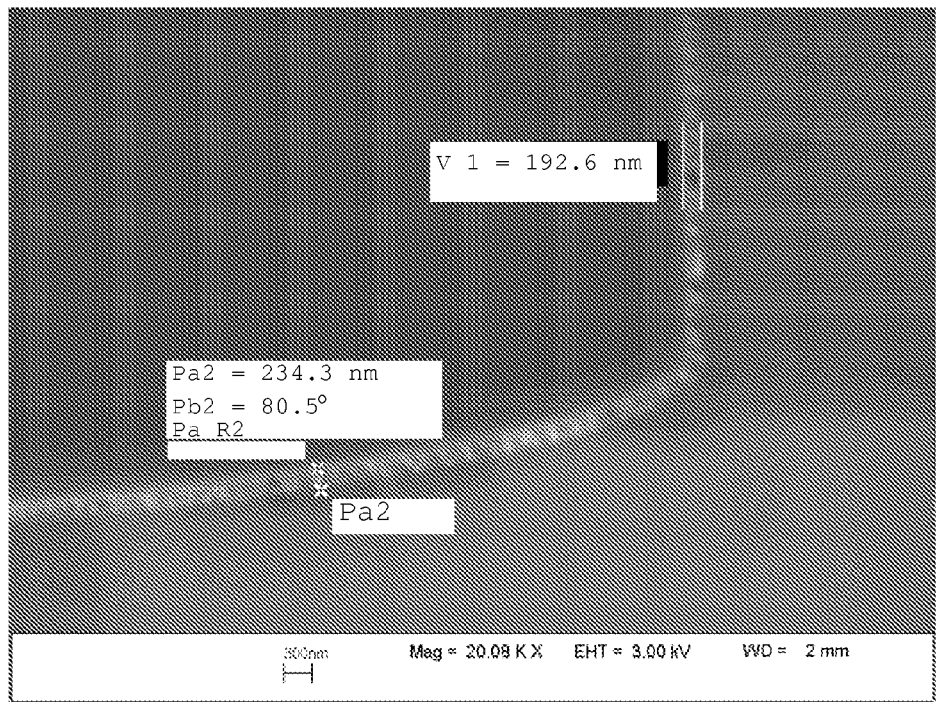
FIG. 8C is a SEM photograph with magnification of about 20,080 times showing a cross section of a Ta layer deposited adjacent to a bottom portion of a trench formed in a semiconductor substrate according to a conventional vapor deposition process.
Figure 8D:
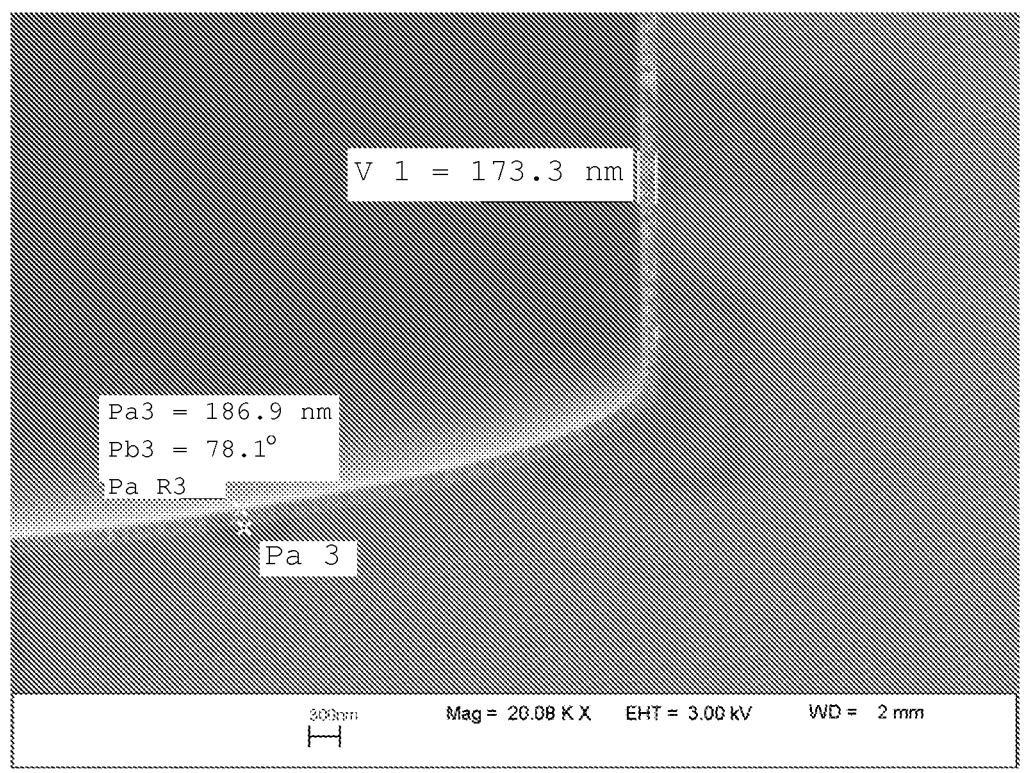
FIG. 8D is a SEM photograph with magnification of about 20,080 times showing a cross section of a Ta layer deposited adjacent to a bottom portion of a trench formed in a semiconductor substrate according to a HIPIMS method and apparatus according to an aspect of the invention.

FIGS. 8C and 8D provide a similar comparison of the results of deposition with the present method and apparatus relative to conventional vapor deposition results under similar deposition atmospheric conditions. FIG. 8C is a SEM photograph with magnification of about 20,080 times showing a cross section of a Ta layer deposited adjacent to a bottom portion of a trench formed in a semiconductor substrate according to a conventional vapor deposition process. The deposition rate of the conventional vapor deposition was about 2.5 nm/s.

In contrast, FIG. 8D is a SEM photograph with magnification of about 20,080 times showing a cross section of a Ta layer deposited adjacent to a bottom portion of a similar trench as that shown in FIG. 8C formed in a semiconductor substrate according to a HIPIMS method and apparatus according to an aspect of the invention, and under similar conditions. As can be seen, the vertically-oriented, columnar grains extending through the Ta layer deposited with the present method and apparatus have a higher density and are much less pronounced that those columnar grains in the conventionally-deposited Ta layer. Again, fewer pores result from the present HIPIMS method and apparatus than result from conventional vapor deposition methods and apparatuses, allowing a thinner barrier layer, for example, to be deposited to suitably minimize diffusion of Cu, for example, into an underlying device. The deposition rate of the Ta layer shown in FIG. 8D was about 1.3 nm/s.

Illustrative embodiments have been described, hereinabove. It will be apparent to those skilled in the art that the above devices and methods may incorporate changes and modifications without departing from the general scope of this invention. It is intended to include all such modifications and alterations within the scope of the present invention. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A method of magnetically enhanced sputtering an electrically-conductive material onto interior surfaces of a trench comprising substantially vertical side walls and an aspect ratio of at least 10:1 formed in a semiconductor substrate that is supported by a pedestal, the method comprising:
   providing a magnetic field adjacent to a surface of a target formed at least in part from the electrically-conductive material to be sputtered onto the interior surfaces of the trench;
   applying a DC voltage between an anode and a cathode in a plurality of pulses, wherein the cathode includes the target;
   applying a pulsed high-frequency signal comprising a plurality of high-frequency pulses to the pedestal supporting the semiconductor substrate to generate a self-bias field adjacent to said semiconductor substrate, said high-frequency signal being applied to the pedestal at a frequency within a range of from about 1 MHz to about 70 MHz during the high-frequency pulses and each of the high frequency pulses having a duration that extends beyond termination of the pulse of the voltage between the anode and the cathode; and
   during each pulse of the DC voltage applied between the anode and the cathode, depositing the electrically-conductive material from the target onto the substantially vertical side walls of the trench formed in the semiconductor substrate.

2. The method of claim 1 further comprising matching an impedance of a load supplied with the high-frequency signal to cause a maximum self-bias voltage to occur approximately simultaneously with a maximum DC current during the pulse of voltage applied between the anode and the cathode.

3. The method of claim 1, wherein the high-frequency signal has a power within a range from about 300 Watts to about 3,000 Watts.

4. The method of claim 1, wherein the step of applying the high-frequency signal comprises:
   initiating each high-frequency pulse of the high-frequency signal before each pulse of the DC voltage applied between the anode and the cathode;
   maintaining each high-frequency pulse of the high-frequency signal while the DC voltage is applied between the anode and the cathode and for a period of time after the pulse of DC voltage between the anode and cathode is terminated; and
   terminating each high-frequency pulse of the high-frequency signal only after expiration of the period of time after the pulse of DC voltage between the anode and the cathode is terminated.

5. The method of claim 1, wherein the DC voltage is repeatedly applied at and has a duty cycle within a range from about 0.5% to about 10%.

6. The method of claim 1, wherein the frequency is about 13.56 MHz.

7. The method of claim 1, wherein the frequency has a range from about 1 MHz to about 50 MHz.

8. The method of claim 1 further comprising tuning the frequency to minimize power reflected by a load back to a source of the high-frequency signal.

9. The method of claim 8, wherein the frequency is tuned to within five percent (5%) of 13.56 MHz.

10. The method of claim 8, wherein tuning the frequency is commenced after application of the high-frequency signal to the pedestal.

11. A method of fabricating a stacked arrangement of a plurality of semiconductor substrates collectively supporting an integrated circuit, the method comprising:
   forming a trench in a first semiconductor substrate, said trench comprising an opening at a top of the first semiconductor substrate and substantially vertical side walls, said trench comprising an aspect ratio of at least 10:1;

supporting the first semiconductor substrate including the trench with a pedestal;

sputtering an electrically-conductive material on interior side walls of the trench according to a method comprising:

providing a magnetic field adjacent to a surface of a target formed at least in part from the electrically-conductive material to be sputtered onto the interior surfaces of the trench;

applying a DC voltage between an anode and a cathode in a plurality of pulses, wherein the cathode includes the target;

applying a pulsed high-frequency signal comprising a plurality of high-frequency pulses to the pedestal supporting the first semiconductor substrate to generate a self-bias field adjacent to said first semiconductor substrate, said high-frequency signal being applied to the pedestal at a frequency within a range of from about 1 MHz to about 70 MHz during the high-frequency pulses and each of the high frequency pulses having a duration that extends beyond termination of the pulse of the DC voltage between the anode and the cathode; and during each pulse of the voltage applied between the anode and the cathode, depositing the electrically-conductive material from the target onto the substantially vertical side walls of the trench formed in the semiconductor substrate; and subsequent to sputter depositing the electrically-conductive material onto the interior side walls of the trench, removing a portion of semiconductor material adjacent to a bottom planar surface of the semiconductor substrate to at least partially expose the electrically-conductive material on the side walls at the bottom planar surface of the semiconductor substrate.

12. The method according to claim 11 further comprising:

aligning the electrically-conductive material at least partially exposed at the bottom planar surface of the at least one semiconductor substrate with an electrical contact provided to a second semiconductor substrate; and electrically connecting the electrical contact and the electrically-conductive material at least partially exposed at the bottom planar surface of the first semiconductor substrate to form the stacked arrangement.

13. A sputtering apparatus for magnetically-enhanced sputtering an electrically-conductive material onto interior surfaces of a trench formed in a semiconductor substrate, said trench comprising substantially vertical side walls and an aspect ratio of at least 10:1, said system comprising:

a housing defining a substantially enclosed chamber;

a pedestal exposed to said chamber for supporting the semiconductor substrate at an appropriate position within said chamber during sputtering;

a magnet assembly for providing a magnetic field adjacent to a surface of a target formed at least in part from the electrically-conductive material to be sputtered onto the interior surfaces of the trench;

a DC power supply for applying a DC voltage between an anode and a cathode in a plurality of pulses, wherein the cathode includes the target;

a variable power source electrically connected to the pedestal for applying a pulsed high-frequency signal comprising a plurality of high-frequency pulses to the pedestal for supporting the semiconductor substrate to generate a self-bias field adjacent to said semiconductor substrate; and a controller for controlling the variable power source to generate the pulsed high-frequency signal at a frequency within a range from about 1 MHz to about 70 MHz during the high-frequency pulses and applying the high-frequency signal to the pedestal such that each of the high-frequency pulses has a duration that extends beyond termination of the pulse of the DC voltage between the anode and the cathode.

14. The sputtering apparatus of claim 13 further comprising an impedance matching network for matching an impedance of a load supplied with the high-frequency signal generated by the variable power source to establish a maximum self-bias voltage approximately simultaneously with a maximum DC current delivered by the DC power source during the pulse of voltage applied between the anode and the cathode.

15. The sputtering apparatus of claim 13, wherein the high-frequency signal has a power within a range of about 300 Watts to about 3,000 Watts.

16. The sputtering apparatus of claim 13, wherein the controller controls operation of the DC voltage to repeatedly apply the DC voltage with a duty cycle falling within a range of about 0.5% to about 10%.

17. The sputtering apparatus of claim 13, wherein the controller also tunes the frequency of the high-frequency signal to minimize power reflected by a load back to the variable power source.

18. The sputtering apparatus of claim 17, wherein the frequency is tuned to within five percent (5%) of 13.56 MHz.

19. The sputtering apparatus of claim 18, wherein the controller tunes the frequency after application of the high-frequency signal to the pedestal and in response to the load supplied with the high-frequency signal.

20. The method according to claim 4 wherein the step of terminating the high-frequency pulses of the high-frequency signal includes terminating each of the high-frequency pulses before initiating one of the pulses of DC voltage between the anode and the cathode immediately subsequent to the pulse of DC voltage between the anode and the cathode.

* * * * *

UNITED STATES PATENT AND TRADEMARK OFFICE
CERTIFICATE OF CORRECTION

PATENT NO. : 8,475,634 B2
APPLICATION NO. : 12/257570
DATED : July 2, 2013
INVENTOR(S) : Jurgen Weichart et al.

Page 1 of 1

It is certified that error appears in the above-identified patent and that said Letters Patent is hereby corrected as shown below:

On the Title Page

Item (73) Assignee: please delete "AF" and add -- AG --

In the Specification

Column 5, line 53, please delete "$V_{AC}$" and add -- $V_{DC}$ --

Signed and Sealed this
Eighth Day of October, 2013

Teresa Stanek Rea
*Deputy Director of the United States Patent and Trademark Office*